(12) United States Patent
Ferianz (10) Patent No.: US 6,800,926 B2
(45) Date of Patent: Oct. 5, 2004

(54) TRACKING CIRCUIT

(75) Inventor: Thomas Ferianz, Glanegg (AT)

(73) Assignee: Infineon Technologies AG, Munich (DE)

( * ) Notice: Subject to any disclaimer, the term of this patent is extended or adjusted under 35 U.S.C. 154(b) by 2 days.

(21) Appl. No.: 10/353,600

(22) Filed: Jan. 28, 2003

(65) Prior Publication Data

US 2003/0183851 A1 Oct. 2, 2003

Related U.S. Application Data

(63) Continuation of application No. PCT/EP01/08669, filed on Jul. 26, 2001.

(30) Foreign Application Priority Data

Aug. 1, 2000 (DE) ......................................... 100 37 452

(51) Int. Cl.[7] ............................................... H01L 31/11
(52) U.S. Cl. ...................... 257/565; 257/565; 257/552
(58) Field of Search ................................. 257/565, 544, 257/546, 547, 548; 327/110; 326/64

(56) References Cited

U.S. PATENT DOCUMENTS 5,519,339 A * 5/1996 Martin ........................ 326/84
5,578,862 A * 11/1996 Fujii et al. .................. 257/547
5,929,506 A * 7/1999 Hutter et al. ................ 257/544
6,498,521 B1 * 12/2002 Bicakci et al. .............. 327/110

FOREIGN PATENT DOCUMENTS

| DE | 41 24 732 A1 | 3/1992 |
| EP | 0 314 226 A2 | 5/1989 |
| EP | 0 449 093 A1 | 10/1991 |
| EP | 0 556 743 A1 | 8/1993 |
| EP | 0 742 590 A2 | 11/1996 |
| JP | 59-149046 | 8/1984 |
| WO | WO 96/36997 | 11/1996 |

* cited by examiner

Primary Examiner—David Nelms
Assistant Examiner—Thinh T Nguyen
(74) Attorney, Agent, or Firm—Jenkins, Wilson & Taylor, P.A.

(57) ABSTRACT

Tracking circuit for tracking the voltage potential of an insulation well for the insulation of an integrated component (1) embedded in the insulation well, the voltage potential of the insulation well being tracked in a manner dependent on a signal voltage output by the integrated transistor (1) in such a way that the voltage difference between the output signal voltage and the tracked voltage potential is lower than a predetermined breakdown voltage ($U_{DA}$) between the integrated transistor (1) and the insulation well.

4 Claims, 5 Drawing Sheets

TRACKING CIRCUIT

RELATED APPLICATIONS

This application is a continuation of PCT patent application number PCT/EP01/08669, filed Jul. 26, 2001, which claims priority to German patent application number 10037452.2, filed Aug. 1, 2000, the disclosures of each of which are incorporated herein by reference in their entire.

TECHNICAL FIELD

The invention relates to a tracking circuit for tracking the voltage potential of an insulation well which is provided for the insulation of an integrated component embedded therein from a substrate.

BACKGROUND ART

Figure 1:
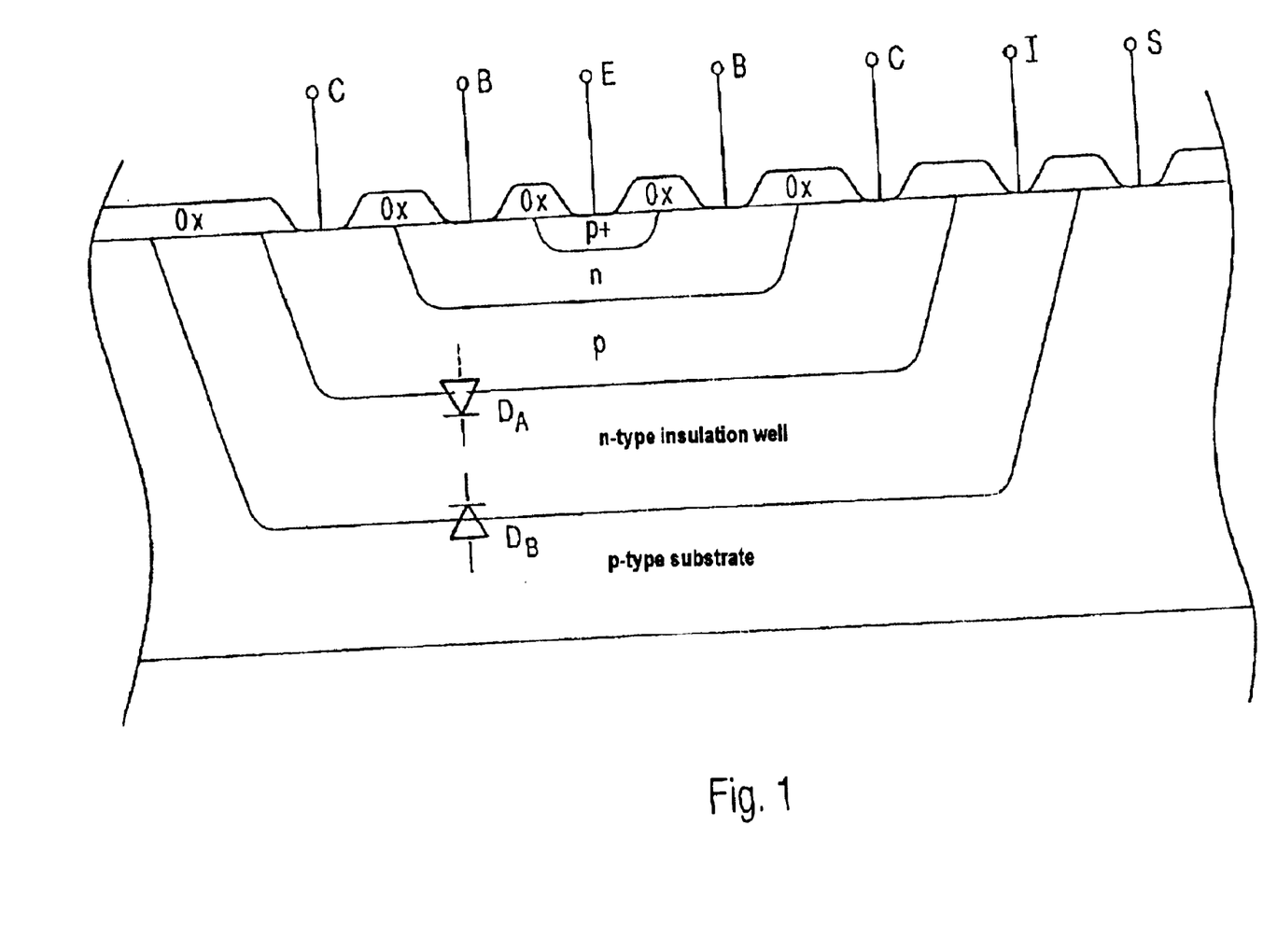
FIG. 1 shows a vertically constructed integrated pnp bipolar transistor according to the prior art

FIG. 1 shows a sectional view through an integrated vertical PNP transistor which is embedded in an n-doped insulation well. The integrated vertical PNP transistor illustrated in FIG. 1, according to the prior art, can be fabricated in a BICMOS process. In the case of the vertically integrated bipolar transistor, the current flows perpendicularly to the orientation of the substrate body. The current flows from a p$^+$-doped emitter region through an n-doped base region to a p-doped collector region. The p$^+$-doped emitter region is connected to an emitter terminal E, the n-doped base region is connected to base terminals B and the p-doped collector region is connected to collector terminals C. The n-doped insulation well is connected to a terminal I for controlling the potential of the n-doped insulation well. The p-doped semiconductor substrate is connected to a substrate terminal S. The integrated transistor is surrounded by the n-doped insulation well which insulates the integrated transistor from the surrounding semiconductor substrate. Between the p-doped collector region and the n-doped insulation well there is a PN junction, which forms a parasitic diode $D_a$. Between the p-doped semiconductor substrate and the n-doped insulation well there is a further PN junction, which is represented as a parasitic diode $D_b$. The two diodes $D_a$ and $D_b$ each have breakdown voltages which are prescribed by various parameters, such as, for example, doping, geometry and temperature. In the case of a vertical bipolar transistor fabricated using BICMOS technology, the breakdown voltage of the diode $D_a$ is about 18 volts, while the breakdown voltage of the diode $D_b$ is about 30 volts. In order that the n-doped insulation well insulates the integrated transistor embedded therein from the p-doped semiconductor substrate, the n-doped insulation well must always have a higher potential than the p-doped collector region and the p-doped semiconductor substrate. In order that this condition is met, in the case of conventional circuits, the insulation well is terminated via the insulation well terminal I to the positive supply voltage +$V_{DD}$ and the semiconductor substrate is terminated via the substrate terminal S to the negative supply voltage $V_{SS}$. This ensures that the two PN junctions $D_a$ and $D_b$ are always operated in the reverse direction, thereby ensuring an insulation of the integrated transistor from the semiconductor substrate. To ensure that there is no electrical breakdown of the n-doped insulation well in the collector region at the PN junction $D_a$, the supply voltage +$V_{DD}$ must always be lower than the breakdown voltage of the diode $D_a$ operated in the reverse direction, i.e. the maximum supply voltage is about 18 volts.

In the case of conventional circuits, the supply voltage $V_{DD}$ applied to the n-doped insulation well must meet the following conditions:

$$\left. \begin{array}{l} V_{DD} \leq U_{DA} \\ V_{DD} \leq U_{DB} \end{array} \right\} \quad (1)$$

where $U_{DA}$ is the breakdown voltage of the PN junction between the collector region of the transistor and the insulation well and $U_{DB}$ is the breakdown voltage of the PN junction between the semiconductor substrate and the insulation well.

Furthermore, the collector-emitter breakdown voltage $U_{CED}$ between the p-doped collector region and the p$^+$-doped emitter region is not permitted to be exceeded, the collector-emitter breakdown voltage typically being about 30 volts.

Since the breakdown voltage of the PN junction $D_a$ is generally lower than the breakdown voltage of the PN junction $D_b$, the maximum supply voltage for an integrated circuit constructed from vertical bipolar transistors is limited by the breakdown voltage $U_{DA}$, which is about 18 volts. On account of the limited supply voltage $V_{DD}$, the output voltage levels of a circuit constructed from integrated transistors of this type is likewise limited to the breakdown voltage of the PN junction. However, higher voltage level swings are necessary in many applications. By way of example, a full rate ADSL driver circuit requires a voltage swing of 24 volts.

SUMMARY OF THE INVENTION

Therefore, the object of the present invention is to provide a device which allows integrated components which are fabricated in simple standard technologies to be operated with a higher supply voltage in order that a higher voltage level swing is achieved.

This object is achieved according to the invention by means of a tracking circuit having the features specified in Patent Claim 1.

The invention provides a tracking circuit for tracking the voltage potential of an insulation well for the insulation of an integrated component embedded in the insulation well, in particular of a transistor, from a substrate, the voltage potential of the insulation well being tracked in a manner dependent on a signal voltage output by the integrated component in such a way that the voltage difference between the applied signal voltage and the tracked voltage potential is lower than a predetermined breakdown voltage between the integrated component and the insulation well.

The insulation well is preferably embedded in the substrate.

The integrated transistor is preferably a bipolar transistor.

The integrated bipolar transistor is preferably a vertical bipolar transistor.

The vertical bipolar transistor preferably has a first doping region as emitter terminal, a second doping region as base terminal and a third doping region as collector terminal, the second doping region lying between the first and third doping regions and having an opposite doping to the first and second doping regions.

The insulation well preferably encloses the third doping region.

The breakdown voltage between the substrate and the insulation well is preferably higher than the breakdown voltage between the third doping region and the insulation well.

The tracking circuit preferably has an input for receiving the signal voltage applied to the integrated transistor and an output for connection to the insulation well of the integrated transistor.

In a particularly preferred embodiment, the tracking circuit has a tracking transistor, which is constructed complementarily to the integrated transistor.

The tracking transistor is preferably a bipolar transistor.

In a particularly preferred embodiment of the tracking circuit according to the invention, the tracking transistor has a collector terminal, which is connected to the output of the tracking circuit, an emitter terminal, which is connected to the input of the tracking circuit, and a base terminal, which is connected to a predetermined reference-ground potential.

A first resistor is preferably provided between the emitter terminal of the tracking transistor and the input of the tracking circuit.

Furthermore, a second resistor is preferably provided between the collector terminal of the tracking transistor and a supply voltage terminal of the tracking circuit.

In a particularly preferred embodiment of the tracking circuit according to the invention, a diode for increasing the breakdown voltage of the tracking transistor is provided between the first resistor and the emitter terminal of the tracking transistor.

The integrated transistor is preferably fabricated in a BICMOS fabrication process.

The integrated bipolar transistor is preferably a PNP bipolar transistor.

In an alternative embodiment, the integrated transistor is an NPN bipolar transistor.

In an alternative embodiment, the integrated transistor is a MOSFET surrounded by an insulation well.

The insulation well is preferably constructed from a plurality of layers having different doping strengths.

The integrated transistor is preferably a driver transistor of an ADSL driver circuit.

The breakdown voltage between the integrated transistor and the insulation well is preferably about 18 volts.

The breakdown voltage between the insulation well and the substrate is preferably about 30 volts.

The supply voltage which can be applied to the integrated transistor is preferably about 24 volts.

Preferred embodiments of the tracking circuit according to the invention are described below with reference to the accompanying figures in order to elucidate features that are essential to the invention.

DETAILED DESCRIPTION OF THE INVENTION

Figure 2:
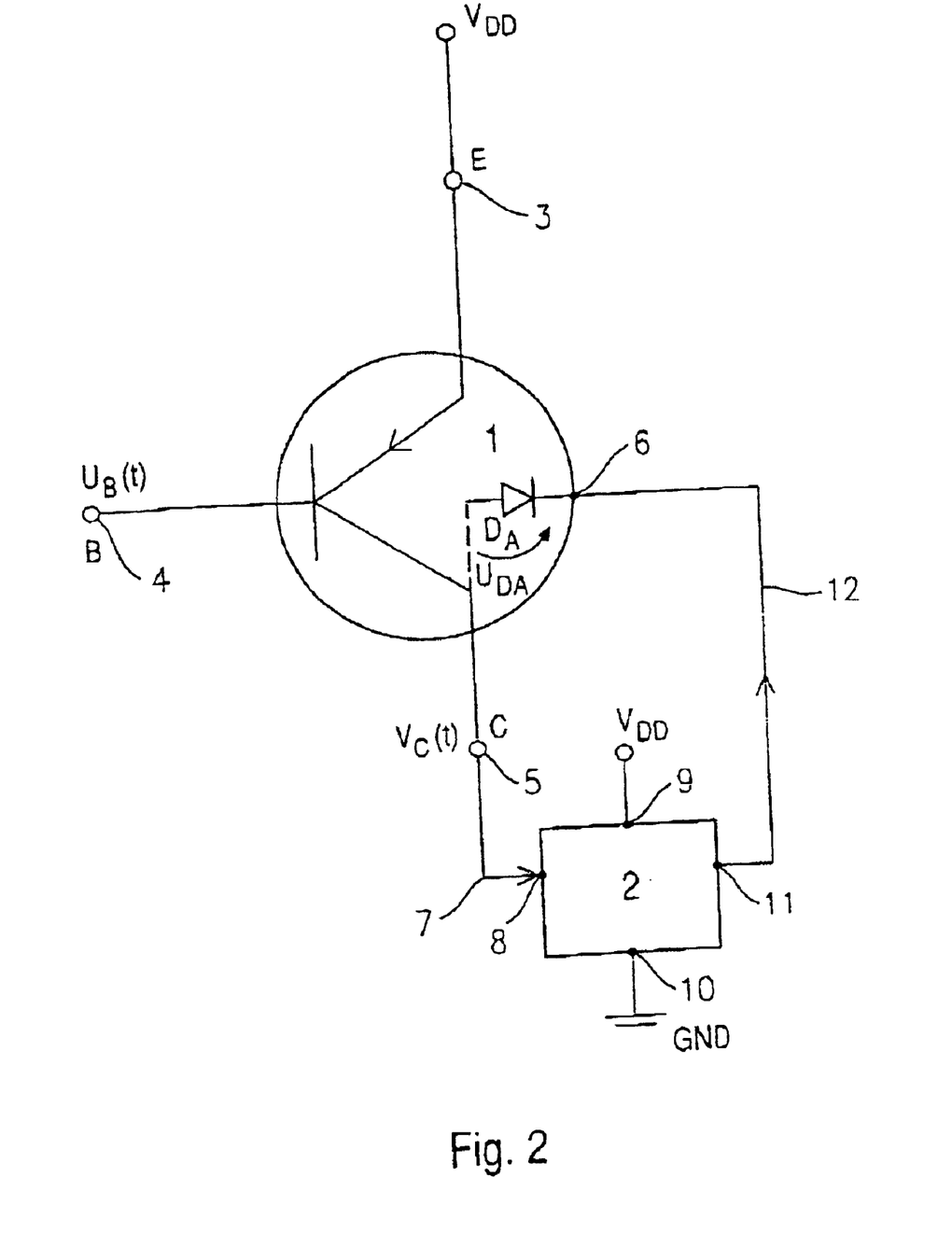
FIG. 2 shows a circuit for elucidating the principle on which the invention is based.

FIG. 2 illustrates a circuit diagram with a transistor 1 which is driven by the tracking circuit 2 according to the invention. In the case of the example illustrated in FIG. 2, the transistor 1 is a PNP bipolar transistor, in particular a vertically constructed PNP bipolar transistor. The transistor 1 has an emitter terminal 3, a base terminal 4 and a collector terminal 5. Furthermore, the transistor 1 has a terminal 6 for the connection of an insulation well which insulates the transistor 1 from the substrate. Between the collector region and the insulation well terminal 6, the PN junction between the p-doped collector region and the n-doped insulation well region is indicated by dashes as diode $D_a$. The emitter terminal 3 of the transistor 1 is connected to the positive supply voltage $V_{DD}$. At the base terminal 4, the PNP transistor receives a voltage signal $U_B(t)$, which is output as signal $V_C(t)$ at the collector terminal 5 and is applied via a line 7 to a signal input 8 of the tracking circuit 2 according to the invention. The tracking circuit 2 is preferably likewise connected to the positive supply voltage $V_{DD}$ via a supply voltage terminal 9. The tracking circuit 2 furthermore has a terminal 10 for connecting the tracking circuit to a reference-ground potential (for example ground GND). Via a signal output 11 and a line 12, the tracking circuit 2 outputs a tracking control signal to the insulation well terminal 6 of the bipolar transistor 1. In this case, the voltage potential of the insulation well is tracked in a manner dependent on the signal voltage $V_C(t)$ output by the integrated transistor 1 in such a way that the voltage difference between the output signal voltage $V_C(t)$ and the tracked voltage potential is lower than the predetermined breakdown voltage $U_{DA}$ between the collector region of the integrated transistor and the insulation well. This ensures that, in the case of the PNP bipolar transistor, the n-doped insulation well always has a higher voltage potential than the collector region, and that the potential difference between the two regions never exceeds the breakdown voltage $U_{DA}$ of 18 volts, for example. The maximum supply voltage $V_{DD}$ at the PNP bipolar transistor can therefore be increased, so that the bipolar transistor 1 can output an output signal with a higher voltage level swing.

Figure 3:
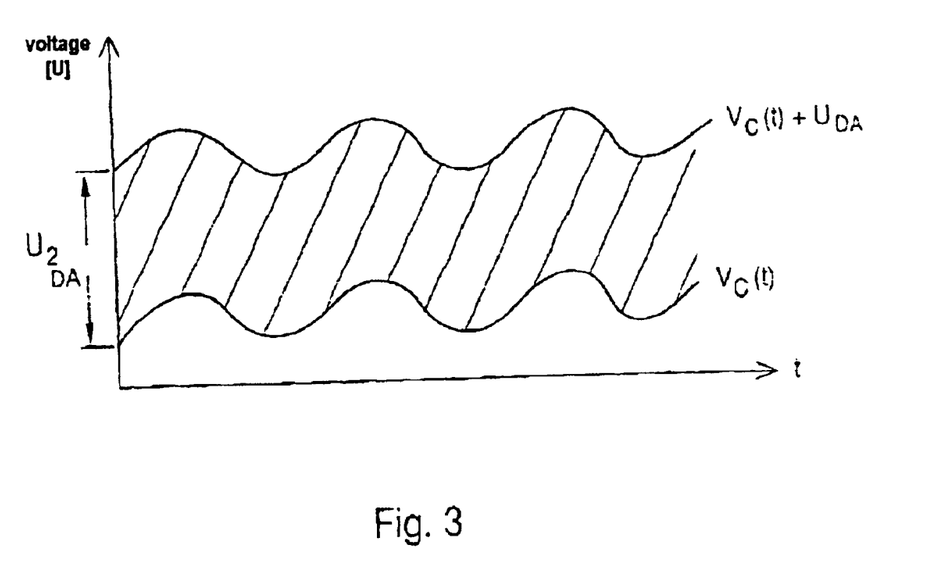
FIG. 3 shows a timing diagram for illustrating the permissible voltage range of the insulation well.

FIG. 3 shows a timing diagram for illustrating the permissible operating voltage range of the n-doped insulation well of the PNP bipolar transistor 1. The tracking circuit 2 according to the invention ensures that the potential of the insulation well is always in a range between a lower limit $V_C(t)$ and an upper limit $V_C(t)+U_{DA}$.

$$V_C(t)+U_{DA} \geq V_{insulation\ well} \geq V_C(t) \qquad (2)$$

Furthermore, the following must hold true:

$$U_{DB} \geq V_C(t)+U_{DA} \qquad (3)$$

In this case, UDA is the breakdown voltage between the p-doped collector region of the integrated transistor 1 and the n-doped insulation well and $U_{DB}$ is the breakdown voltage of the p-doped semiconductor substrate and the n-doped insulation well.

In the case of an integrated vertical bipolar transistor fabricated in a BICMOS fabrication process, the breakdown voltage $U_{DB}$ is typically about 30 volts, while the breakdown voltage $U_{DA}$ is about 18 volts.

Figure 4:
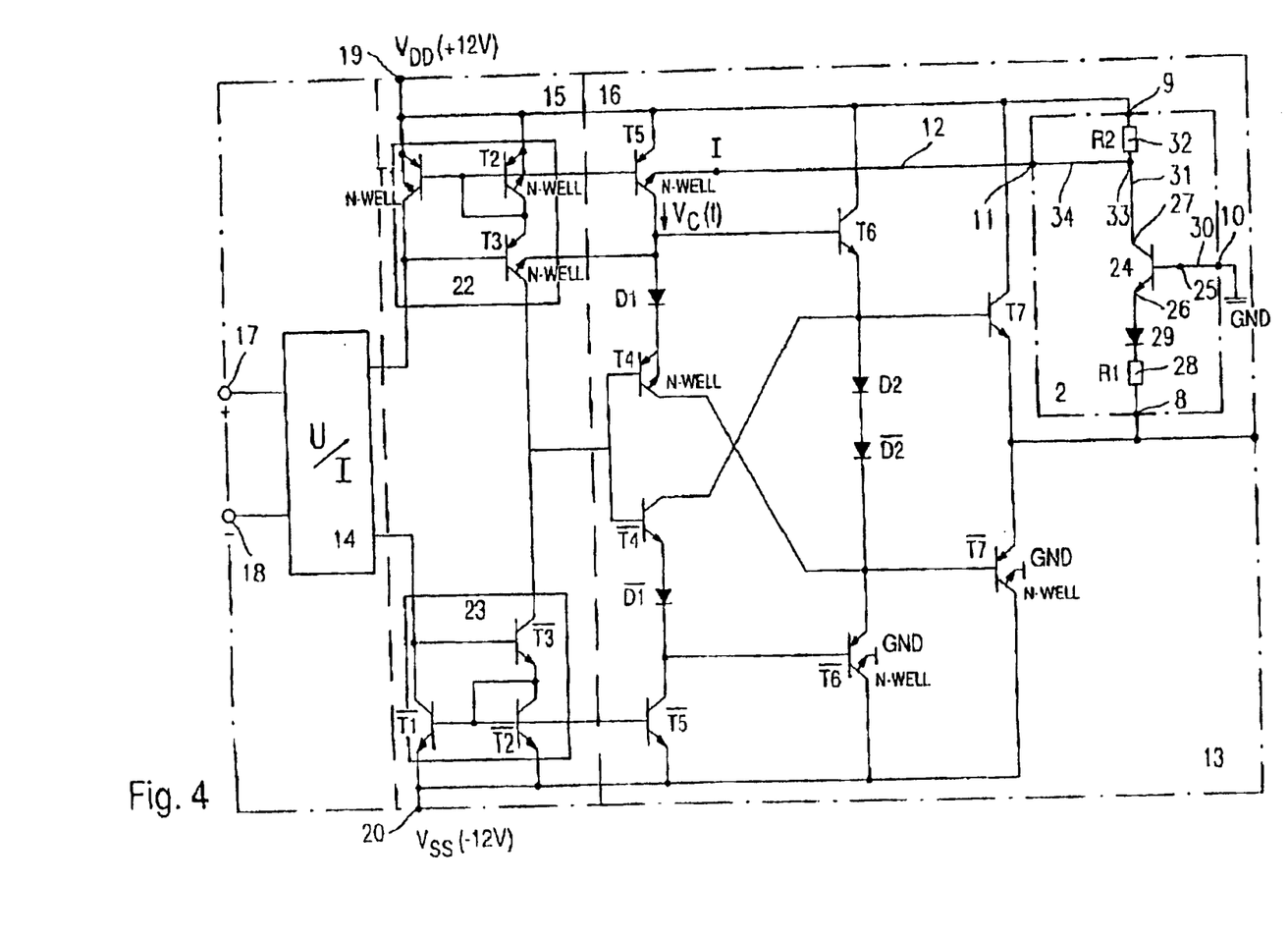
FIG. 4 shows a driver circuit in which a preferred embodiment of the tracking circuit according to the invention is used.

FIG. 4 shows a driver circuit in which the tracking circuit 2 according to the invention is used. The driver circuit 13 has a voltage/current conversion stage 14, an input stage 15 and an output stage 16 for the AB operation. The driver circuit 13 is a current feedback amplifier stage. The driver circuit 13 can be used as an ADSL driver circuit and, as can be discerned from FIG. 4, is supplied with a supply voltage of $V_{DD}$=+12 volts and $V_{SS}$=−12 volts. The driver circuit 13 has a noninverting input 17 and an inverting input 18. Voltage is supplied via supply voltage terminals 19, 20. The driver circuit 13 furthermore has a low-impedance signal output 21, with which large loads (i.e. small resistances) can be current-driven. The input stage 15 receives a current signal from the voltage-current converter 14 and carries out current mirroring. For this purpose, the input stage 15 has two current mirror circuits 22, 23 which are constructed complementarily to one another and carry out current mirroring in a ratio of 1:1. The current mirror circuit 22 contains the transistors T1, T2, T3 and the current mirror circuit 23 which is constructed complementarily thereto contains the transistors $\overline{T1}$, $\overline{T2}$, $\overline{T3}$. The output stage 16 contains two driver transistors T5, $\overline{T5}$ which are constructed complementarily to one another. At the collector terminals of the driver transistors T5, $\overline{T5}$, transistors T6, T7 and $\overline{T6}$, $\overline{T7}$, respectively, are in each case connected in cascade form as emitter followers. The emitter followers serve for the impedance conversion. The diodes D1, $\overline{D1}$ and D2, $\overline{D2}$, respectively, in each case serve for the shunt current setting. In the case of the transistors T3, T4 and T5, it is necessary to carry the n-doped insulation well in a signal-dependent manner since the variable signal voltage is present at their collector terminals. The n-doped insulation well of the remaining PNP transistors is put at a fixed potential since the collector terminals of these transistors are also connected to fixed voltage potentials or only slightly variable voltage potentials. In this case, it is ensured that the potential of the n-doped insulation well is always a higher potential than the potential of the collector terminal. The n-doped well of the transistor T1 and of the transistor T2 are therefore connected to the positive supply voltage $V_{DD}$. The n-doped insulation wells of the transistors $\overline{T6}$ and $\overline{T7}$ that are connected up as emitter followers are connected to the ground potential. The n-doped insulation well of the transistor T3 is connected to the anode of the diode D1 since this, in a manner governed by the circuit, is always two diode threshold voltages higher than the potential of the collector terminal of T3. The n-doped insulation well of the transistor T4 is connected to the cathode of the diode D1.

In the case of the driver transistor T5, the tracking circuit 2 according to the invention is used for tracking the voltage potential of the n-doped insulation well. For this purpose, the insulation well terminal I of the driver transistor T5 is connected via the driving line 12 to the output 11 of the tracking circuit 2 according to the invention. The input 8 of the tracking circuit 2 is connected to the signal output 21 of the driver circuit 13 and receives the collector output signal $V_C(t)$ of the driver transistor T5, said signal being offset by two base-emitter voltages $U_{BE}$.

The tracking circuit 2 tracks the voltage potential of the insulation well of the driver transistor T5 to the collector output signal $V_C(t)$ output by the driver transistor T5. In this case, the voltage potential of the insulation well is tracked in such a way that the voltage difference between the signal voltage $V_C(t)$ output by the transistor T5 and the tracked voltage potential present at the insulation well terminal I is lower than the predetermined breakdown voltage between the integrated transistor T5 and the insulation well.

The tracking circuit 2 contains a tracking transistor 24, which is constructed complementarily to the driver transistor 5. In the example illustrated in FIG. 4, the tracking transistor 24 is an NPN bipolar transistor. It is preferably a vertically constructed bipolar transistor which is fabricated in a BIC-MOS fabrication process. The tracking transistor has a base terminal 25, an emitter terminal 26 and a collector terminal 27. The signal input 8 of the tracking circuit 2 is connected to the emitter terminal 26 of the tracking transistor 24 via a first resistor 28 and a diode 29. The base terminal 25 of the tracking transistor 24 is directly connected via a line 30 to the terminal 10 for the application of a reference-ground potential. The reference-ground potential is preferably the ground potential GND, which lies in the center between the second balanced supply voltages $+V_{DD}$ of 12 volts and $-V_{SS}$ of $-12$ volts. The collector terminal 27 of the tracking transistor 24 is connected via a line 31 to a second resistor 32, which is connected to the positive supply voltage $+V_{DD}$ by one terminal. The line 31 has a branching node 33, which is connected to the output 11 of the tracking circuit 2 via a line 34.

Figure 5:
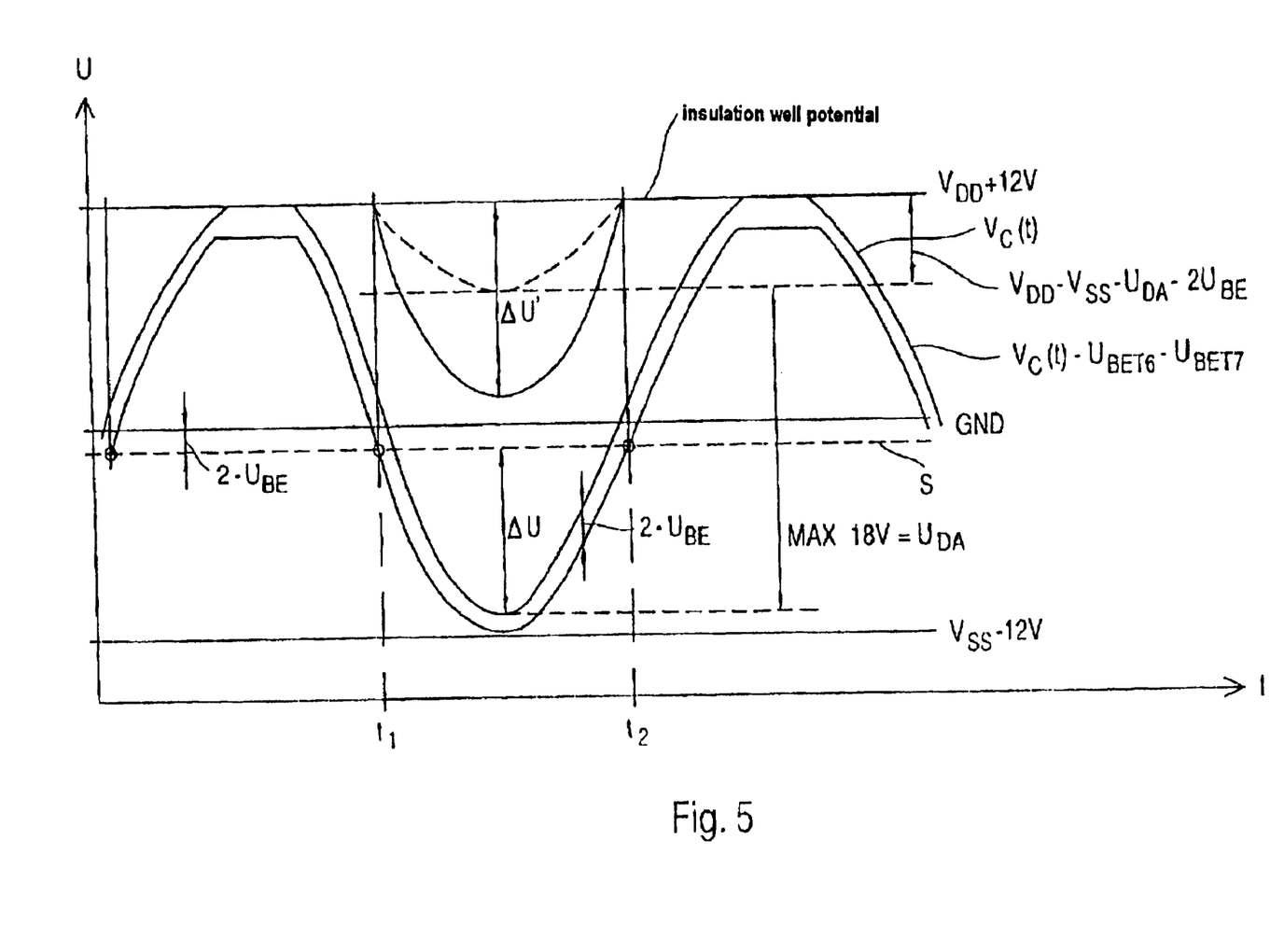
FIG. 5 shows a timing diagram for elucidating the method of operation of the tracking circuit according to the invention which is used in FIG. 4.

FIG. 5 shows a timing diagram for elucidating the method of operation of the tracking circuit 2 according to the invention as is illustrated in FIG. 4. The positive supply voltage $+V_{DD}$ and the negative supply voltage $-V_{SS}$ of 12 volts in each case and also the central reference-ground potential of zero volts are shown. The switching threshold of the tracking circuit lies below the reference-ground potential GND, and is two base-emitter voltages lower than the reference-ground potential GND, namely the base-emitter voltage of the tracking transistor 24 and the diode 29 constructed as a transistor. The output signal $V_C(t)$ at the collector of the driver transistor T5 is a sinusoidal signal which is limited by the positive supply voltage $V_{DD}$ and whose upper signal wave crests are capped. The signal at the input 8 of the tracking circuit 2 is likewise two base-emitter voltages below the collector output signal of the driver transistor T5. The two base-emitter voltages are the base-emitter voltages $U_{BE}$ of the two transistors T6, T7. At the instants t1, t2, the voltage signal present at the input 8 of the tracking circuit 2 intersects the switching threshold of the tracking circuit 2. Up to the instant t1 and from the instant t2, the voltage potential at the insulation well terminal of the driver transistor T5 is connected to the positive supply voltage $V_{DD}$ via the second resistor 32 and is constant. Between the instants t1, t2, the voltage potential at the insulation well terminal I of the driver transistor T5 is lowered by a voltage $\Delta U'$. In this case, the following holds true:

$$\left. \begin{array}{l} \Delta U' = \Delta U \cdot \dfrac{R_{32}}{R_{28}} \\ \Delta U = V_{(c)}t - U_{BET6} - U_{BET7} + 2U_{BE} \end{array} \right\} \quad (4)$$

where $\Delta U$ is the difference voltage between the switching threshold S and the signal voltage at the input terminal 8 of the tracking circuit 2, $U_{BET6}$ is the base-emitter voltage of T6, $U_{BET7}$ is the base-emitter voltage of T7 and $U_{BE}$ is the base-emitter voltage of the tracking transistor 24 or of the diode 29.

FIG. 5 furthermore shows in dashed fashion the upper limit which must not be exceeded by the n-doped insulation well region of the transistor T5. The minimum of the upper limits is given by:

$$U_{min} = V_{DD} - V_{SS} - U_{DA} - 2U_{BE} \quad (5)$$

As can be seen from FIG. 5, the potential at the insulation well terminal I of the driver transistor T5 always lies below the upper permissible limit.

Furthermore, the following holds true for the dimensioning of the two resistors 28, 32:

$$\frac{U_{min}}{\Delta U} \le \frac{R_{33}}{R_{28}} \le 1 \tag{6}$$

The following thus results for typical values:

$$\frac{12V - (-12V) - 18V - 2 \cdot 0,7V}{-(-12V) - 2 \cdot 0,7V} = \frac{4,6}{10,6} = 0,434 \le \frac{R_{32}}{R_{28}} \le 1 \tag{7}$$

The upper limit of the resistance ratio $R_{32}:R_{28}=1$ ensures that the collector of the tracking transistor 24 does not fall below the base voltage of the tracking transistor 24 at the base terminal 25, since saturation of the tracking transistor 24 would otherwise occur.

As long as the signal-dependent collector potential of the driver transistor T5 does not fall below the reference-ground potential, the potential of the n-doped insulation well is held at the positive supply voltage potential via the resistor 32. If the collector potential falls below the reference-ground potential or the ground potential, the tracking transistor 24 opens. Given a resistance ratio $R_1:R_2=1$, the negative signal half-cycle at the collector terminal of the driver transistor T5 is shifted in the positive direction in terms of potential with the magnitude of the positive supply voltage $V_{DD}+2U_{BE}$. It is thus ensured that the potential at the n-doped insulation well of the driver transistor T5 is always less than 12 volts and the breakdown voltage, which is about 18 volts, is never reached.

As can be seen from FIG. 4, the tracking circuit 2 according to the invention makes it possible to construct a driver circuit 13 which is operated with a high supply voltage of 24 volts ($V_{DD}$, $V_{SS}$), conventional driver transistors being used which, without the tracking circuit 2 according to the invention, would have to operate at lower supply voltages. The driver circuit 13 illustrated in FIG. 4 enables high supply voltage signal swings corresponding to the high supply voltage ($V_{DD}$, $V_{SS}$), at the same time the transistors being able to be fabricated by conventional standard fabrication processes, for example by a BICMOS fabrication process. It is thus possible, in particular, to construct ADSL driver circuits or full rate ADSL line drivers which are operated with a supply voltage of 20 volts.

Besides being used for bipolar transistors, the tracking circuit 2 according to the invention can be used for arbitrary integrated components which are embedded in insulation wells and whose breakdown voltage [lacuna] the insulation well with respect to the substrate. Such components are, inter alia, MOSFET transistors and well resistors.

LIST OF REFERENCE SYMBOLS

1 Integrated transistor
2 Tracking circuit
3 Emitter terminal
4 Base terminal
5 Collector terminal
6 Insulation well terminal
7 Line
8 Input of the tracking circuit
9 Supply voltage terminal
10 Reference-ground potential terminal
11 Output of the tracking circuit
12 Tracking line
13 Driver circuit
14 Supply current converter
15 Input stage
16 Output stage
17 Inverting input
18 Inverting input
19 Supply voltage terminal
20 Supply voltage terminal
21 Signal output of the driver circuit
22,23 Current mirror circuits
24 Tracking transistor
25 Base terminal
26 Emitter terminal
27 Collector terminal
28 Resistor
29 Diode
30 Line
31 Line
32 Resistor
33 Node
34 Line

What is claimed is:

1. Compensation circuit for compensating the voltage potential of an isolation tub for isolating an integrated bipolar transistor that is embedded in the isolation tub, whereby the voltage potential of the isolation tub is compensated in dependency on a signal voltage emitted by the integrated bipolar transistor in such a way that the voltage differential between the emitted signal voltage and the compensated voltage potential is lower than a predetermined breakdown voltage between the integrated bipolar transistor and the isolation tub, whereby the compensation circuit exhibits an input for receiving a signal voltage emitted by the integrated bipolar transistor, an output for connecting to the isolation tub of the integrated bipolar transistor, and a compensation transistor that is set up complementary to the integrated bipolar transistor, whereby a collector terminal of the compensation transistor is connected with the output of the compensation circuit, an emitter terminal of the compensation transistor is connected with the input of the compensation circuit, and whereby a base terminal of the compensation transistor is connected to a predetermined reference potential, wherein a first resistor is provided between the emitter terminal of the compensation transistor and the input of the compensation circuit.

2. Compensation circuit for compensating the voltage potential of an isolation tub for isolating an integrated bipolar transistor that is embedded in the isolation tub, whereby the voltage potential of the isolation tub is compensated in dependency on a signal voltage emitted by the integrated bipolar transistor in such a way that the voltage differential between the emitted signal voltage and the compensated voltage potential is lower than a predetermined breakdown voltage between the integrated bipolar transistor and the isolation tub, whereby the compensation circuit exhibits an input for receiving a signal voltage emitted by the integrated bipolar transistor, an output for connecting to the isolation tub of the integrated bipolar transistor, and a compensation transistor that is set up complementary to the integrated bipolar transistor, whereby a collector terminal of the compensation transistor is connected with the output of the compensation circuit, an emitter terminal of the compensation transistor is connected with the input of the compensation circuit, and whereby a base terminal of the compensation transistor is connected to a predetermined reference potential, wherein a second resistor is provided between the collector terminal of the compensation transistor and a supply voltage terminal of the compensation circuit.

3. Compensation circuit for compensating the voltage potential of an isolation tub for isolating an integrated bipolar transistor that is embedded in the isolation tub, whereby the voltage potential of the isolation tub is compensated in dependency on a signal voltage emitted by the integrated bipolar transistor in such a way that the voltage differential between the emitted signal voltage and the compensated voltage potential is lower than a predetermined breakdown voltage between the integrated bipolar transistor and the isolation tub, whereby the compensation circuit exhibits an input for receiving a signal voltage emitted by the integrated bipolar transistor, an output for connecting to the isolation tub of the integrated bipolar transistor, and a compensation transistor that is set up complementary to the integrated bipolar transistor, whereby a collector terminal of the compensation transistor is connected with the output of the compensation circuit, an emitter terminal of the compensation transistor is connected with the input of the compensation circuit, and whereby a base terminal of the compensation transistor is connected to a predetermined reference potential, wherein a first resistor is provided between the emitter terminal of the compensation transistor and the input of the compensation circuit, and wherein a diode for increasing the breakdown voltage of the compensation transistor is placed between the first resistor and the emitter terminal of the compensation transistor.

4. Compensation circuit for compensating the voltage potential of an isolation tub for isolating an integrated bipolar transistor that is embedded in the isolation tub, whereby the voltage potential of the isolation tub is compensated in dependency on a signal voltage emitted by the integrated bipolar transistor in such a way that the voltage differential between the emitted signal voltage and the compensated voltage potential is lower than a predetermined breakdown voltage between the integrated bipolar transistor and the isolation tub, whereby the compensation circuit exhibits an input for receiving a signal voltage emitted by the integrated bipolar transistor, an output for connecting to the isolation tub of the integrated bipolar transistor, and a compensation transistor that is set up complementary to the integrated bipolar transistor, whereby a collector terminal of the compensation transistor is connected with the output of the compensation circuit, an emitter terminal of the compensation transistor is connected with the input of the compensation circuit, and whereby a base terminal of the compensation transistor is connected to a predetermined reference potential, wherein the isolation tub is made of several layers of varying doping strength.

* * * * *